United States Patent

Marschall

[15] 3,691,554

[45] Sept. 12, 1972

[54] CODE CONVERTERS

[72] Inventor: Peter Marschall, 6040 Seiler Dr., Cincinnati, Ohio 45239

[22] Filed: June 18, 1971

[21] Appl. No.: 154,570

Related U.S. Application Data

[63] Continuation-in-part of Ser. No. 877,975, Nov. 19, 1969.

[52] U.S. Cl. ............................340/347 DD, 235/154

[51] Int. Cl. ................................................G06f 3/00

[58] Field of Search.........340/347 DD; 235/155, 154

[56] References Cited

UNITED STATES PATENTS

| | | | |
|---|---|---|---|
| 3,440,646 | 4/1969 | Dean | 340/347 DD |
| 3,613,091 | 10/1971 | Thomas | 340/347 DD |
| 3,624,636 | 11/1971 | Irwin | 340/347 DD |
| 3,631,464 | 12/1971 | Dahlberg | 340/347 DD |
| 3,631,471 | 12/1971 | Griffiths | 340/347 DD |

*Primary Examiner*—Maynard R. Wilbur
*Assistant Examiner*—Jeremiah Glassman
*Attorney*—John W. Melville et al.

[57] ABSTRACT

An electronic code converter which will accept data signals of a predetermined format having a specified number of bits from a first data processing apparatus and converts such data signals to a different code format having a specified number of bits for use by a second data processing apparatus.

5 Claims, 4 Drawing Figures

INVENTOR/S

PETER MARSCHALL

BY Melville, Strasser, Foster and Hoffman
ATTORNEYS

INVENTOR/S

PETER MARSCHALL

BY *Melville, Strasser, Foster and Hoffman*
ATTORNEYS

INVENTOR/S
PETER MARSCHALL
BY Melville, Strasser, Foster and Hoffman
ATTORNEYS

INVENTOR/S

PETER MARSCHALL

BY Melville, Strasser, Foster and Hoffman
ATTORNEYS

CODE CONVERTERS

CROSS REFERENCE TO A RELATED APPLICATION

This application is a continuation-in-part application of Application Ser. No. 877,975, filed Nov. 19, 1969, in the name of PETER MARSCHALL.

BACKGROUND OF THE INVENTION

1. Field of the Invention

The present invention relates to electronic means of converting code formats of data signals in the art relating to data processing equipment.

2. Description of the Prior Art

Prior art electronic code conversion means have proven less than desirable for a number of reasons. First, such code conversion means have usually been designed for the conversion of specific code formats of a particular need. As a consequence, the choice of electronic circuit components and the chosen arrangement of interconnecting such components, though most reliable and economical for a particular application, does not lend itself in a practical sense, to applications wherein the code format presented to the input of the code conversion means changes to a number of different configurations. For example, in U.S. Letters Pat. No. 3,440,646, in the name of E.M. Dean, code conversion means are provided which basically convert an input code format consisting of six bits. Substantial additions of circuit components with significant changes in interconnecting these components are necessary if the Dean code conversion means is also used for applications where the input code format may consist of six, seven or eight bits.

It is, therefore, an object of the present invention to provide an improved electronic code conversion means which is easily adaptable to changes in the input code format, such changes also including changes in the number of bits in such formats.

It is a further object of the present invention provide an improved electronic code conversion means characterized by a choice of electronic circuit components and a particular arrangement of interconnecting such components, which will accept changes in the input code format, including a wide range in the number of bits in such formats, without requiring additions to such circuit components.

It is still another object of the present invention to provide an improved electronic code conversion means which will permit a practical and direct relationship between the amount circuit components required and the number of different character symbols whose representative code format must be converted. In practice, the code conversion means of the present invention will afford great economics when a particular application involves only a few character symbols.

SUMMARY OF THE INVENTION

The present invention accomplishes the aforementioned objectives by providing an improved electronic code conversion means which includes means for storing the logic value of input code bits on a temporary basis so that they may be acted upon by a plurality of decoder means. The decoder means convert the representation of character symbols from the particular multi-bit input code format to that of a single bit appearing on the output lead of one of the decoder means associated with a particular character symbol. The output from each decoder means is connected to a code formating means which will expand the single bit from the decoder means to a new multi-bit code format. Each code formating means has a plurality of output leads each of which will indicate the logic value of a particular bit of the new code format. Output leads from all code formating means are appropriately interconnected so that the new code formats of all character symbols are represented on one common set of output leads of the electronic code conversion means.

DESCRIPTION OF THE PREFERRED EMBODIMENT

Figure 1:
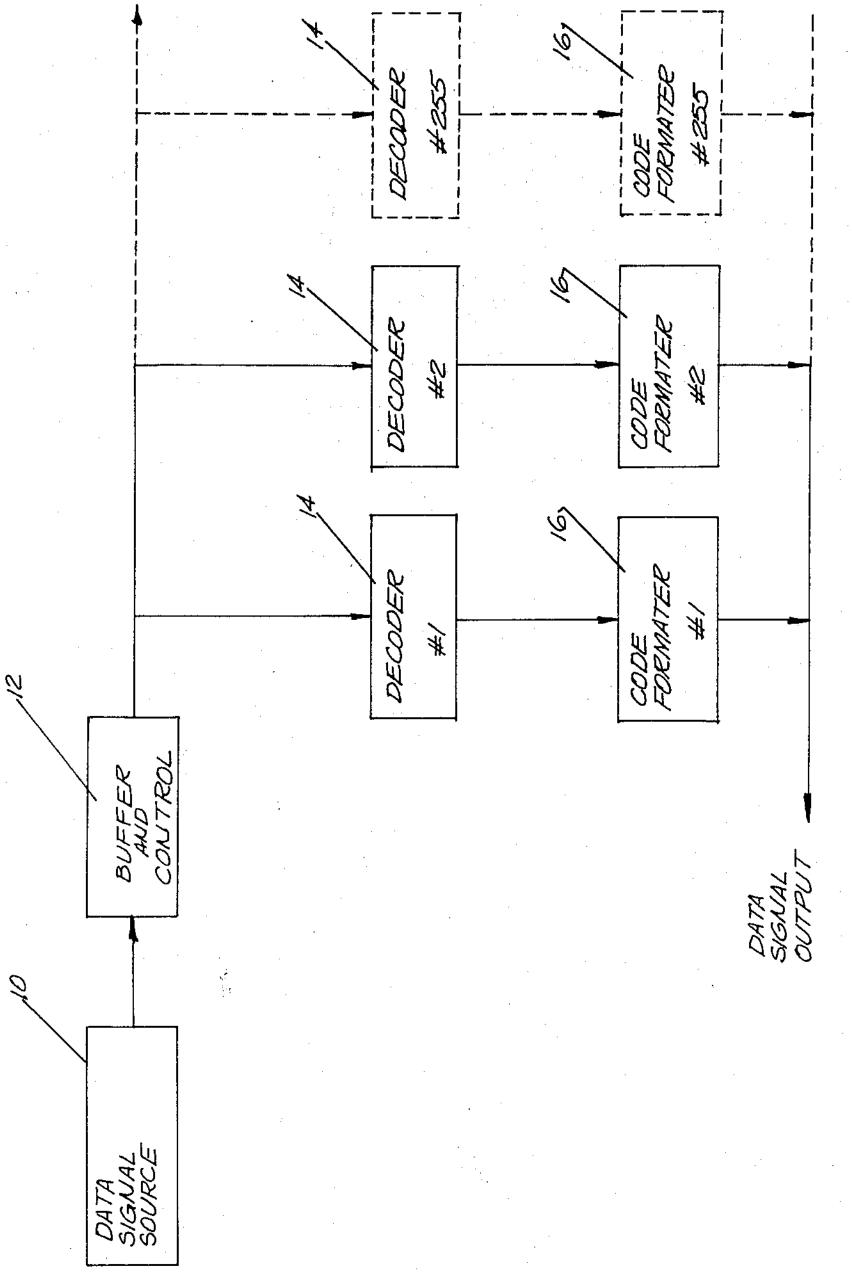
FIG. 1 is an overall block diagram illustrating generally the major components comprising the electronic code conversion means of the present invention.

As shown in FIG. 1, the data signal source 10 represents the data signal output terminal from typical data processing equipment. The data signals represent alpha-numeric or control character symbols. For the purpose of this description, each character is represented by data signals of a parallel code format having a specified number of bits. Each bit signal takes on a binary form both in its electrical and logic value. There are in use today a large number of code formats which differ in number of bits and logic value assigned to each. Within each code format, data signals representing different characters have a singular and unique combination of binary logic values assigned to the bit signals.

There is further shown in FIG. 1, buffer and control means for the purpose of receiving the bit signals from the source 10 and doubling the number of bits before presenting the bit signals to the inputs of every decoder means 14.

Figure 2:
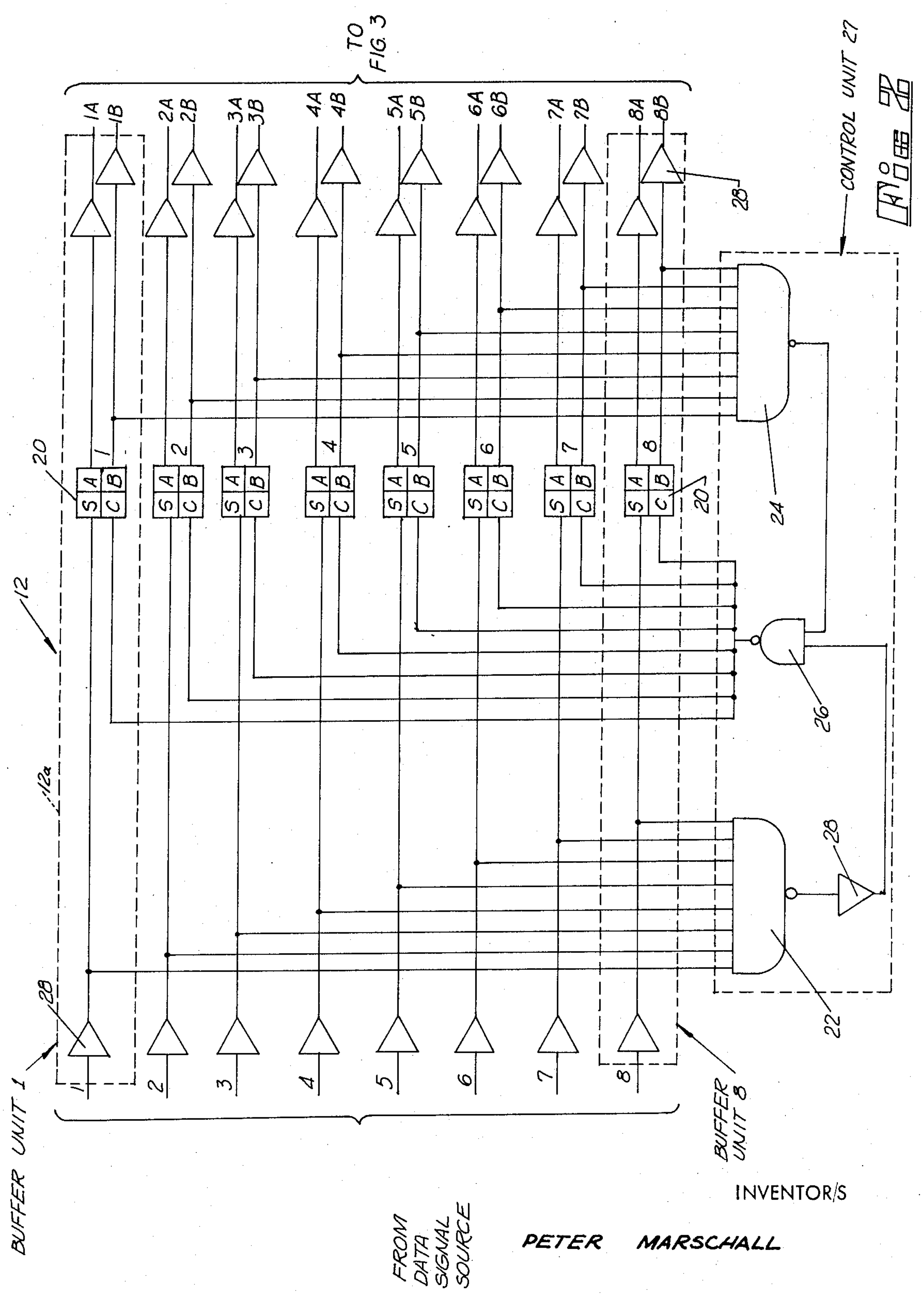
FIG. 2 is a schematic diagram illustrating the control and buffer means of the code conversion means.

FIG. 2 discloses a schematic illustration of the buffer and control means 12. The buffer and control means 12 comprises a plurality of buffer units 12*a*, eight of which are shown. Each buffer unit 12a will receive bit signals of a particular bit position number in the code format. As a bit signal is presented to the appropriate buffer unit 12*a*, it passes through a logic value inversion gate 28 and appears on the S input lead of a storage circuit 20, which then generates two bit signals, one on each of the output leads A and B. The logic value of the bit signal on the output lead A always corresponds to the logic value of the input lead S. The logic value of the bit signal on the output lead B is always opposite that of the lead A. The bit signals on the output leads A and B pass through further logic value inversion gates 28 before being presented to the input leads of the decoder means 14. Each storage circuit 20 is referred to in the electronic art as a " flip-flop" circuit.

As further shown in FIG. 2, a control unit or control means 27, which includes one logic value inversion gate 28 and multi-input lead logic NAND gates 22, 24 and 26, serve the purpose of controlling the storage circuits 20. When control signals from the gate 26 are presented to the C input leads of all the storage circuits 20, the logic value of the bit signals on all of the A output leads are made identical. The same is true for the bit signals on the B output leads. This logic value condition of all of the storage circuits 20 is referred to as the "normal" condition. The gate 26 will generate a control signal when the gate 22 has detected the removal of all of the bit signals from the leads S, indicating no data signals present. The gate 26 will stop generating a control signal when the gate 24 has detected that all of the storage circuits 20 are in the normal condition.

Figure 3:
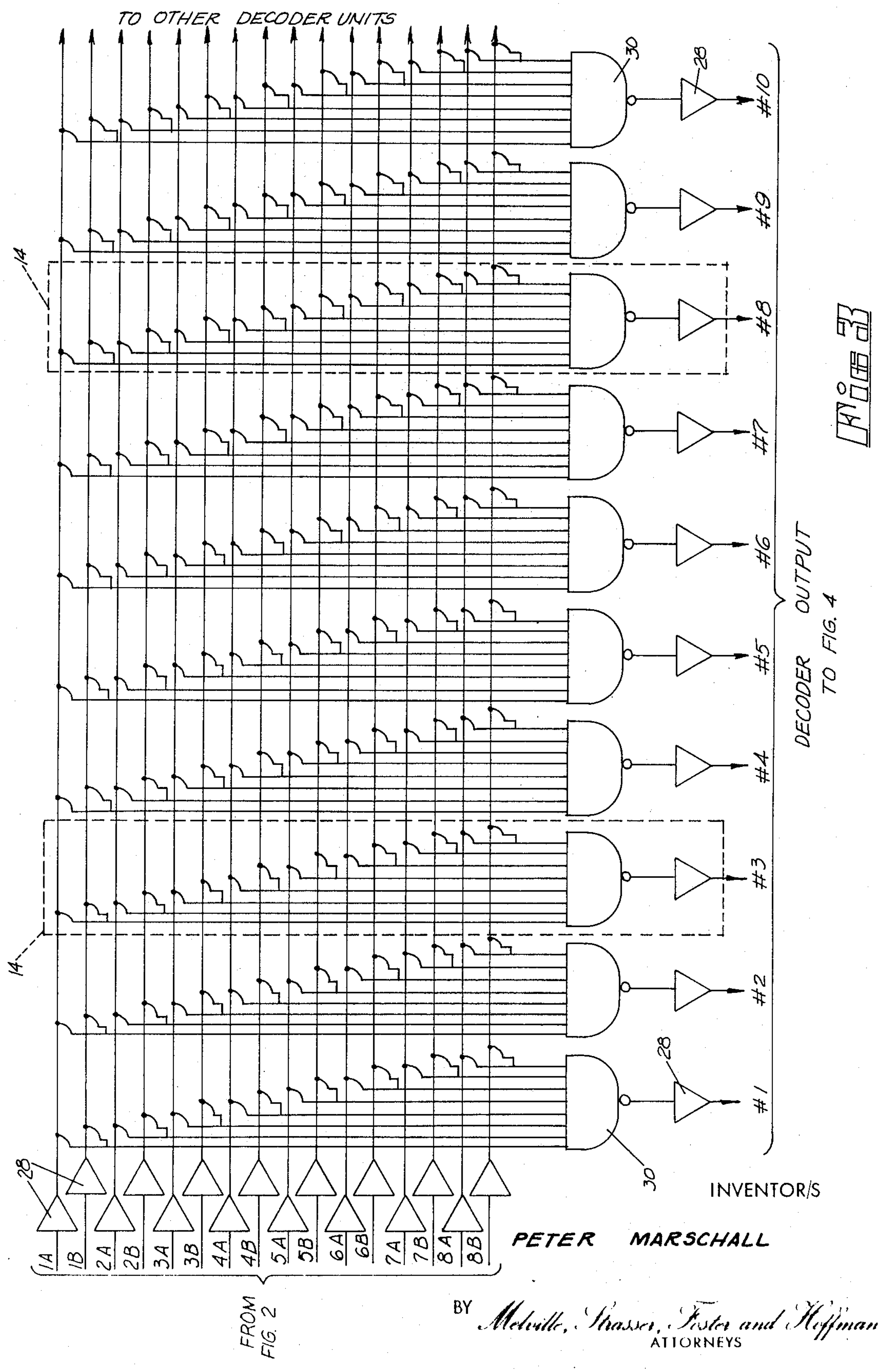
FIG. 3 is a schematic diagram illustrating the decoder means and their interconnection to the buffer means.

The bit signals from the buffer units 12*a* of FIG. 2 are transmitted to the decoder means 14 over a signal distribution system as shown in FIG. 3. As further shown in FIG. 3, each decoding means 14 comprises a multi-input logic NAND gate 30 and one logic value inversion gate 28. In order for a bit signal to be generated at the output lead of a decoding means 14, it is necessary that bit signals of identical logic value be presented to every input lead of the same decoder means 14.

As can be seen in FIG. 3, the signal distribution system consists primarily of an extension of the output leads A and B of the buffer and control means 12, and means for connecting these leads with appropriate input leads of the decoder means 14. Each input lead of a decoder means 14 is either connected to an A or B buffer unit output lead depending upon the logic value of the bit signal of a specified bit position number of a known input code format which is to be recognized by a specific decoder means 14.

For purposes of explanation, the operation of the buffer units 12a, as shown in FIG. 2, with the decoder means 14, as shown in FIG. 3, will be demonstrated with the following example.

Let it be assumed that the data signal source 10 operates in the following code format:

| | |
|---|---|
| Bit Position Number | 1 2 3 4 5 6 7 8 |
| Bit Signals for Letter "*d*" | – – * * * – – – |
| Bit Signals for Numeral "9" | – – * – – * * * |

* indicates positive logic value
– indicates negative logic value

For the Letter "*d*":

As the bit signal number 1 is received, it has a negative logic value. As it passes through the buffer unit 1 of FIG. 2, it will receive a positive logic value from the gate 28 and then appear on the S input lead of the storage circuit 20, thereby causing to be generated two new bit signals by the storage circuit 20. The bit signal on the A output lead of the storage circuit 20 will have a positive logic value. The bit signal on the B output lead will have a negative logic value. Both bit signals will undergo double logic value inversion before appearing in the signal distribution network of FIG. 3.

The same process takes place for the other bit signals in position numbers 2 through 8. To summarize for the entire code format of the letter "*d*", the following condition will exist in the signal distribution network:

| | | | |
|---|---|---|---|
| Bit Position Number | 1 2 3 | 5 6 | 7 8 |
| * Logic Values on Leads | A A B | B B A | A A |
| – Logic Values on Leads | B B A | A A B | B B |

For the numeral "9", the signal distribution network will contain:

| | | | |
|---|---|---|---|
| Bit Position Number | 1 2 3 | 4 5 6 | 7 8 |
| * Logic Values on Leads | A A B | A A B | B B |
| – Logic Values on Leads | B B A | B B A | A A |

Let it be assumed that the decoder unit number 3 in FIG. 3 should recognize the code format of the letter "*d*", and that the decoder unit number 4 should recognize the code format of the numeral "9".

Each input lead of a decoder unit 14 is assigned to a bit position number. Therefore the input leads of the decoder unit number 3 will be connected to signal distribution leads 1A, 2A, 3B, 4B, 5B, 6A, 7A, 8A. Input leads of the decoder unit number 4 will be connected to the signal distribution leads 1A, 2A, 3B, 4A, 5A, 6B, 7B, 8B.

Let it now be assumed that the data signal source has been changed and that the letter "*d*" and numeral "9" are now represented by a different code format, such as:

| | |
|---|---|
| Bit Position Number | 1 2 3 4 5 |
| Bit Signals for Letter "*d*" | * – * * – |
| Bit Signals for Numeral "9" | – – * * * |

In accordance with the aforementioned discussion, the input leads of the decoder unit number 3 will be reterminated on the signal distribution leads 1B, 2A, 3B, 4B, 5A, 6B, 7B, 8B. It should be noted that the bit position numbers 6, 7 and 8 are not filled by this code format and are therefore considered as if positive logic valve bit signals were available.

In the same manner, it can be determined that the input leads of the decoder unit number 4 should be reterminated on the signal distribution leads 1A, 2A, 3B, 4B, 5B, 6B, 7B, 8B.

In practice, making the connections in the signal distribution system of FIG. 3 is greatly facilitated by using an overlay templet having connection markings for the particular code format of interest. Screw type contact connects may also be used to improve the speed of making code format changes.

The buffer and control means 12 have been shown in FIg. 2, to contain eight buffer units 12*a*. Additionally, the decoder means 14 have been shown in FIG. 3 with eight input leads on the gates 30. However, in the preferred embodiment of this invention there would be provided 12 buffer units 12*a* in the buffer and control means 12 and each decoder means 14 would be provided with gates 30 having twelve inputs leads. This electronic code conversion means could then be used to convert any code format of up to 12 bits, a range covering most of the popular code formats in use today.

Figure 4:
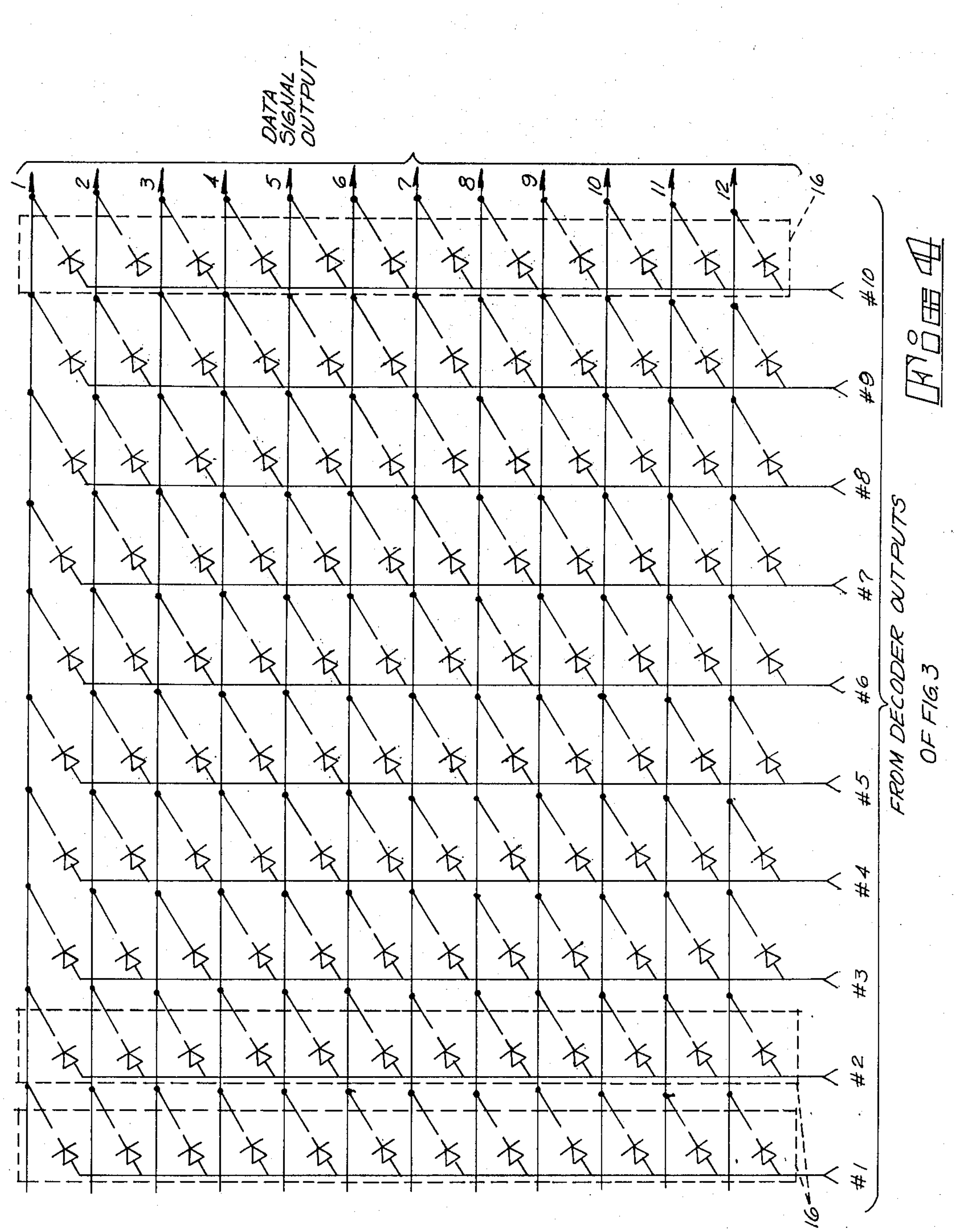
FIG. 4 is a schematic diagram illustrating the code formating means and the interconnection of the associated output leads.

Referring now to FIG. 4, there is shown a schematic illustration of the code formating means 16. Each code formating means 16 consists of a diode expansion gate having the capability of expanding the single bit signal received from a decoding means 14 to a plurality of bit signals conforming to a new parallel code format. As can be seen in FIG. 4, the output leads of every code formating means 16 are connectable to a common set of output leads for the electronic code conversion means. Each lead in this common set is numbered so as to represent a bit position number of a desired code format. For a particular code formating means 16, connections are only made to those numbered output leads of the electronic code conversion means whose bit position number demand a bit signal of positive logic value. In order to facilitate the connection process between the output leads of all the code formating means 16, and the common set of output leads of the electronic code conversion means, overlay templets and screw type contact connections may again be used.

To further clarify the use of the code formating means 16, the following example is given.

The data signal source 10 operates in the following format:

| | |
|---|---|
| Bit Position Number | 1 2 3 4 5 6 7 8 |
| Bit Signals for Letter "*d*" | _ _ * * * _ _ _ |

The desired output code format is as follows:

| | |
|---|---|
| Bit Position Number | 1 2 3 4 5 |
| Bit Signals for Letter "*d*" | * _ * * _ |

The connections to be made in the signal distribution system of FIG. 3 have been previously explained. Let it also be assumed that the decoder means number 3 and the code formating means number 3 are to be used. From code formating means number 3, output leads are connected to leads numbered 1, 3 and 4 in the set of common output leads of the electronic code conversion means.

The number of code formating means 16 and decoding means 14 required, will, of course, depend upon the number of different character symbols, whose code formats must be converted. In the exemplary embodiment there can be a maximum of eight bits in a code format, corresponding to a maximum of 255 different character symbols. However, in the preferred embodiment of this invention the code formating means 16 and the decoding means 14 are physically arranged in such a manner that the user of the electronic code conversion means of the present invention would acquire the same number of code formating means 16 and decoding means 14 as there are different character symbols in a particular application.

While certain preferred embodiments of the invention have been specifically illustrated and described, it is understood that the invention is not limited thereto, as many variations will be apparent to those skilled in the art, and the invention is to be given its broadest interpretation within the terms of the claims.

What we claim is:

1. In an electronic code converter which will accept data signals of a predetermined code format having a specified number of bits from a first data processing apparatus and converts such data signals to a different code format having a specified number of bits for use by a second data processing apparatus, a control and buffer means including a plurality of buffer units which sense bit signals of a particular bit position number in the code format of said first data processing apparatus and double the number of bits thereof, each buffer unit including a logic value inversion gate and a storage circuit including a set lead, a clear lead, a first output lead and a second output lead, and control means to reset each of said storage circuits of said buffer units to normal after all bit signals of a code format are removed therefrom; a plurality of decoder means, each decoder means comprising a multi-input logic NAND gate and a logic value inversion gate, and a signal distribution system comprising an extension of the first and second output leads of each of said storage circuits of said buffer units, and means for connecting said leads with appropriate input leads of said decoder means, each input lead of one of said decoder means being connected to an output lead of one of said buffer units depending upon the logic value of the bit signal of a specified bit position number of the code format of said first data processing apparatus which is to be recognized by a specific decoder means; and a plurality of code formating means each operatively connected to one of said decoder means and connectable to a common set of output leads for said code converter, each said code formating means comprising a diode expansion gate having the capacity of expanding the bit signal from its respective decoding means to a plurality of bit signals conforming to said new code format of said second data processing apparatus.

2. The electronic code converter according to claim 1, wherein said control means of said control and buffer means comprises a first electronic gate which monitors the input of said control and buffer means from said first data processing apparatus, a second electronic gate to sense when all of said storage circuits have been reset to normal, a third electronic gate responsive to said first and second electronic gates which generates a signal to reset said storage circuits of said buffer units to normal, and an electronic logic value inversion gate communicating between said first and second electronic gates.

3. The code converter according to claim 1, wherein said connecting means includes a contact connection for each lead which may be opened and closed as desired.

4. The code converter according to claim 1, wherein said buffer and control means contains eight buffer units, and wherein each decoder means has eight input leads.

5. The code converter according to claim 1, wherein said buffer and control means contains 12 buffer units, and wherein each decoder means has 12 input leads.

* * * * *